United States Patent [19]

Graeme et al.

[11] Patent Number: 5,019,789

[45] Date of Patent: May 28, 1991

[54] ADAPTIVE BIAS CIRCUIT FOR PREVENTING TURNOFF IN A PUSH-PULL STAGE

[75] Inventors: Jerald G. Graeme; Steven D. Millaway, both of Tucson, Ariz.

[73] Assignee: Burr-Brown Corporation, Tucson, Ariz.

[21] Appl. No.: 544,231

[22] Filed: Jun. 26, 1990

[51] Int. Cl.$^5$ .............................................. H03F 3/26
[52] U.S. Cl. ..................................... 330/273; 330/274
[58] Field of Search ............... 330/262, 269, 270, 271, 330/273, 274, 296

[56] References Cited

U.S. PATENT DOCUMENTS

| | | | |
|---|---|---|---|
| 3,379,986 | 4/1986 | Leslie | 330/274 |
| 3,995,228 | 11/1976 | Pass | 330/263 X |
| 4,274,059 | 6/1981 | Okabe | 330/266 |
| 4,401,951 | 8/1983 | Tanaka | 330/268 |
| 4,573,021 | 2/1986 | Widlar | 330/273 |
| 4,922,208 | 5/1990 | Susak et al. | 330/273 X |

*Primary Examiner*—Steven Mottola
*Attorney, Agent, or Firm*—Cahill, Sutton & Thomas

[57] ABSTRACT

A push-pull amplifier circuit includes an NPN pullup transistor and an pulldown transistor, an emitter of the pullup transistor being coupled to a collector of the pulldown transistor. A first resistor is coupled between an output conductor and the emitter of the pullup transistor, and a second resistor is coupled between an emitter of the pulldown transistor and a supply voltage. A bias circuit includes a phase splitting transistor having an emitter coupled to a constant bias current source and a base of the pullup transistor, a collector coupled to a base of the pulldown transistor, and a control electrode coupled to an input signal. The phase splitting transistor steers a portion of the bias current into a first conductor connected to the base of the pullup transistor and a portion of the bias current into a second conductor connected to the base of the pulldown transistor in response to an input signal applied to the control electrode of the phase splitting transistor. A change in an output current flowing through the output conductor changes a base-emitter voltage of the pullup transistor by flowing through the first resistor and changing the voltage across the first resistor to compensate for steering current from the constant bias current source out of the first conductor to maintain a minimum amount of bias current flowing in the pullup transistor when the pulldown transistor is turned on hard, thereby reducing crossover distortion, maintaining output impedance low, and increasing bandwidth of the circuit.

11 Claims, 1 Drawing Sheet

ADAPTIVE BIAS CIRCUIT FOR PREVENTING TURNOFF IN A PUSH-PULL STAGE

BACKGROUND OF THE INVENTION

The invention relates to circuitry and techniques for reducing distortion in the output stage of push-pull amplifiers, preventing bandwidth reduction when a high speed output transistor is turned off in favor of conduction in a slower output transistor, and making the output impedance of the output stage more steady than in prior push-pull amplifier output stages.

Push-pull amplifier stages characteristicly produce distortion due to transistors that turn off as part of the push-pull amplifier operation. Furthermore, the turning off of a high speed output transistor of a push-pull amplifier in favor of increasing current conduction in a slower output transistor of the push-pull amplifier typically results in a reduction in bandwidth and a change in the output impedance of the push-pull amplifier.

The output turn off mechanism of a push-pull amplifier stage can be described with reference to the typical push-pull amplifier circuit 1 of FIG. 1. In this so-called complementary circuit, an NPN pullup transistor 2 and a resistor 4 are connected as an emitter follower to supply an output current $i_o$ through conductor 5, and PNP pulldown transistor 7 is connected with resistor 6 to sink an output current $(-i_o)$ through conductor 5. In order to ease the transition from current "sourcing" of output current by pullup transistor 2 and current "sinking" of output current by pulldown transistor 7 a quiescent bias voltage $V_B$ is applied between the bases of transistors 2 and 7. Usually, bias voltage $V_B$ is developed across diodes such as 9 and 10, which themselves are biased by current source 3.

Bias voltage $V_B$ is absorbed in varying degrees by the current "sourcing" pullup transistor 2 and the current "sinking" pulldown transistor 7 depending on the instantaneous output current $i_o$. When $i_o$ is zero, the current flowing in transistor 2 and resistor 4 also flows in transistor 7 and resistor 6. Then the sourcing and sinking sides of circuit 1 each "absorb" approximately one-half of $V_B$.

When an appropriate value of an input drive signal $e_i$ makes $i_o$ positive, more of bias voltage $V_B$ is required to "support" pullup transistor 2 in its "on" condition and less of $V_B$ is available to bias pulldown transistor 7 in its "on" condition. Therefore, an increase in the current through transistor 2 results in a drop in the current flowing through transistor 7. In the circuit of FIG. 1, the only way that current supplied by transistor 2 can be increased is to decrease the portion of the bias voltage $V_B$ absorbed by transistor 7. This operation completely turns transistor 7 off in response to relatively moderate increases in the current through transistor 2. Similarly, an opposite operation turns off transistor 2 when $i_o$ is negative and transistor 7 is sinking output current. The current through transistor 2 is indicated by curve 2A in FIG. 2, and the current through transistor 7 is indicated by curve 7A in FIG. 2.

The above described push-pull operation produces signal distortion because of nonlinearity of transistors 2 and 7 and mismatches between their operating parameters. The nonlinearity results from the exponential current-voltage relationship of the transistor emitter-base junctions of output transistors 2 and 7. As one of these transistors is turning on and the other is turning off, the distortion due to the emitter-base response reaches its maximum, resulting in crossover distortion. Distortion also results from mismatches in the characteristics of transistors 2 and 7. For example, differences in current gains of transistors 2 and 7 cause a change in the output resistance as the output current $i_o$ reverses polarity.

To avoid such distortion, output stages have been developed that ensure continuous bias of the output transistors. Such bias is shown for the complementary emitter follower stage disclosed in U.S. Pat. No. 3,995,228, in which the bias voltage applied between the bases of the emitter follower transistors is increased as output current increases. This is achieved by means of diodes that couple the circuit output voltage to the bias circuit. Similar circuits are shown in U.S. Pat. No. 4,274,059 (Okabe) and U.S. Pat. No. 4,401,951 (Tanaka). However, the complementary emitter follower stage of such circuits requires both NPN and PNP output transistors; this is frequently undesirable because most integrated circuit manufacturing processes cannot readily produce PNP transistors suitable for the higher current levels needed in the output stage. For this reason, many push-pull amplifier output stages are formed of two output transistors of the same conductivity type. Such stages are push-pull in nature, with fixed bias sources. Therefore, transistor turnoff and its distortion are present in such noncomplementary push-pull output circuit stages.

Such a stage is adapted for continuous bias in U.S. Pat. No. 4,573,021 (Widlar). There, the current in one of the output transistors is sensed and compared to a reference current. The difference found by that comparison is used to drive a feedback loop that adjusts the bias to keep the sensed transistor continuously on. However, that technique greatly increases the complexity of the output stage. For example, implementation of this technique requires addition of a differential amplifier, a reference current, a reference diode, and a sensed diode. Furthermore, this circuit forms a feedback loop containing multiple gain stages each of which adds phase delay and reduces bandwidth.

In "noncomplementary" prior art push-pull amplifier circuits, the collector of the pulldown transistor normally would be connected directly to the output terminal. Under those conditions, the output current has no effect on the bias current of the pullup transistor. The need to turn one of transistors 2 and 7 off in order to turn the other one on strongly is illustrated by the two output transistor collector current curves 2A and 7A in FIG. 2. One of the output devices 2 or 7 always is turned off when there is a significant excursion of the output current $i_o$, obviously resulting in the crossover distortion referred to above. It should be appreciated that the "classic" complementary output stage shown in FIG. 1 is difficult to implement in integrated circuits because it is difficult to manufacture integrated circuit PNP transistors that have good characteristics under high current conditions. Integrated circuit push-pull amplifiers generally are therefore noncomplementary circuits.

Thus, the most relevant known prior art deals with the output transistor turn off problem by altering the fixed bias source, either a constant bias voltage for complementary implementations or a fixed bias current source for noncomplementary implementations. These techniques use feedback from the output to the fixed bias source in order to increase the potential of the bias source under conditions of high current conduction in one of the output transistors.

SUMMARY OF THE INVENTION

Accordingly, it is an object of the invention to provide an improved push-pull amplifier circuit that reduces crossover distortion.

It is another object of the invention to provide a simple, economical push-pull amplifier circuit which both reduces crossover distortion and increases bandwidth over conventional push-pull amplifier circuits.

Briefly described, and in accordance with one embodiment thereof, the invention provides a push-pull output circuit that includes a pullup transistor and a pulldown transistor of a first conductivity type, an emitter of the pullup transistor being coupled to a collector of the pulldown transistor. A first resistor is coupled between an output conductor and the emitter of the pullup transistor, and a second resistor is coupled between an emitter of the pulldown transistor and a first supply voltage conductor. A collector of the pullup transistor is coupled to a second supply voltage conductor. A bias circuit includes a phase splitting transistor having a first current carrying electrode coupled to a constant bias current source and a base of the pullup transistor, a second current carrying electrode coupled to a base of the pulldown transistor, and a control electrode coupled to receive an input signal. A third resistor is coupled between the base of the pullup transistor and the output conductor. A fourth resistor is coupled between the base of the pulldown transistor and a terminal of the second resistor that is coupled to the first supply voltage conductor. The phase splitting transistor steers a first portion of the constant bias current into a first conductor connected to the base of the pullup transistor and the third resistor and a remaining second portion of the constant bias current into a second conductor connected to the base of the pulldown transistor and the fourth resistor in response to an input signal applied to the control electrode of the phase splitting transistor. A change in an output current flowing through the output conductor changes a base-emitter voltage of the pullup transistor by flowing through the first resistor and changing the voltage across the first resistor so as to compensate for steering of some of the current from the constant bias current source out of the first conductor so as to maintain a minimum amount of bias current flowing in the pullup transistor even when the pulldown transistor is turned on hard, thereby reducing crossover distortion, maintaining output impedance low, and increasing bandwidth of the push-pull output circuit.

DETAILED DESCRIPTION OF THE PREFERRED EMBODIMENTS

Figure 1:
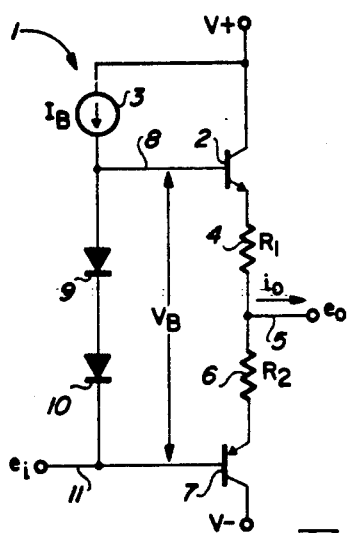
FIG. 1 is a schematic diagram of a circuit useful in describing the prior art.
Figure 2:
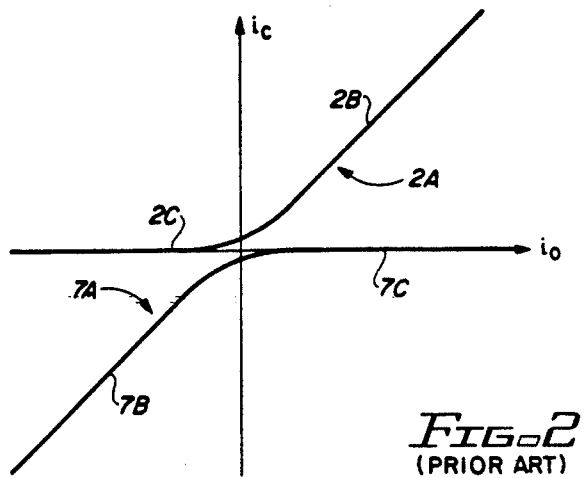
FIG. 2 is a graph useful in describing the prior art circuit of FIG. 1.
Figure 3:
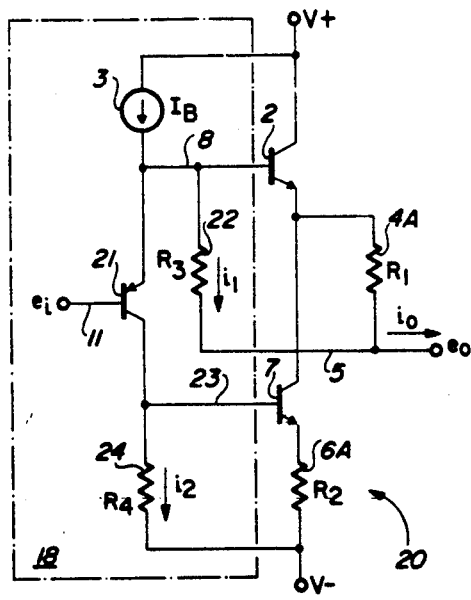
FIG. 3 is a schematic diagram of an embodiment of the present invention.

At the outset, it may be helpful to note that the circuits of the present invention, such as the circuit of FIG. 3 differ from the prior art by connecting the collector of output transistor 7 to the emitter of transistor 2 instead of to the output terminal 5. (Where appropriate, like reference numerals designate like elements in FIGS. 1, 3, and 3A.) This results in a condition wherein collector current drawn by transistor 7 prevents pullup transistor 2 from being turned off when pulldown transistor 7 is turned on strongly. This is an important result, because prior push-pull output circuit stages have a bias voltage or bias current for the output transistors which is shared by the two output transistors. The available bias voltage or bias current is "contributed" to one or the other of the output transistors in greater proportion in accordance with the output current. The closest prior art uses feedback from the output of the push-pull circuit to alter the bias voltage or bias current. In the present invention, a constant available bias current is "steered" to one or the other of the output transistors by the driving signal source which serves as an input to the push-pull output stage, and no feedback is used to alter the available bias voltage o bias current.

In FIG. 3, a unitary push-pull bias circuit 18 is shared by the output transistors 2 and 7. Output transistor 2 is an NPN pullup transistor having its collector connected to V+. The base of transistor 2 is connected by conductor 8 to a constant bias current source 3 (which produces bias current $I_B$), the emitter of a phase splitter PNP transistor 21, and a first terminal of a resistor 22 (which has resistance $R_3$). As mentioned above, the emitter of transistor 2 is connected directly to the collector of NPN pulldown transistor 7. The base of transistor 7 is connected by conductor 23 to the collector of phase splitter transistor 21 and to a first terminal of resistor 24 (which has resistance $R_4$). The input signal of push-pull amplifier 20 is the signal $e_i$, applied by conductor 11 to the base of transistor 21. A second terminal of resistor 24 is connected to V—.

The emitter of pullup transistor 2 also is connected to one terminal of emitter follower resistor 4A (which has resistance $R_1$). The other terminal of resistor 4A is connected to output terminal 5, in which the output current $i_o$ flows. A second terminal of resistor 22 also is connected to output terminal 5. The emitter of pulldown transistor 7 is connected to one terminal of resistor 6A (which has resistance $R_2$). The other terminal of resistor 6A is connected to V—.

In the circuit of FIG. 3, the output current $i_o$ is used to compensate the bias voltage applied to pullup transistor 2. The connection of the emitter of pullup transistor 2 to conductor 5 through resistor 4A and to the collector of pulldown transistor 7 biases pullup transistor 2 continuously on. Pullup transistor 2 is the one that controls critical output characteristics including output impedance and bandwidth for circuit 20. Transistor 7 presents a high output impedance because of its common-emitter configuration. By keeping transistor 2 continuously on, it always dominates the circuit output impedance, keeping it at the low typical output impedance of an emitter follower.

Keeping pullup transistor 2 continuously on also greatly improves bandwidth of push-pull output amplifier 20 because the bandwidth of emitter follower 2,4A is much greater than that of common-emitter-connected transistor 7. Pullup transistor 2 maintains its wide bandwidth through the circuit path from input signal $e_i$ to output signal $e_o$ and thereby bypasses the phase delay of the slower circuit path through pulldown transistor 7.

In operation, current source 3 provides a fixed bias current $I_B$ that is "absorbed" in varying degrees by the two output transistors 2 and 7 in response to demands for output current $i_o$. Push-pull operation is achieved through current steering accomplished by phase splitter transistor 21 in response to $e_i$. Phase splitter transistor 21 provides opposite polarity drive signals to emitter follower transistor 2 and common emitter transistor 7. The currents $i_1$ and $i_2$ establish instantaneous voltages across emitter follower 2,4A and common emitter transistor 7, respectively.

When $i_o$ is zero, the current in pullup transistor 2 also flows in pulldown transistor 7. For this condition, bias current $I_B$ is split approximately equally between $i_1$ and $i_2$. Then, approximately equal voltages are established on resistors 22 and 24 to bias transistors 2 and 7 at about the same current levels.

Figure 4:
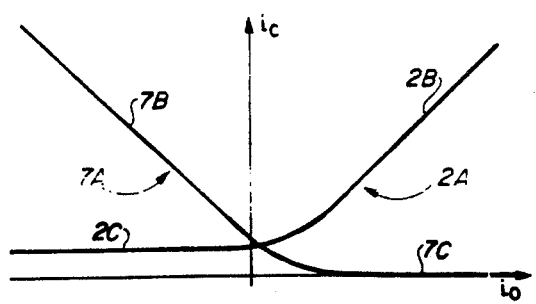
FIG. 4 is a graph useful in describing the operation of the circuits of FIGS. 3 and 3A.

For increasing positive values of $i_o$, the current in pullup transistor 2 is increased by increasing the voltage on resistor 22. This requires more of the current $I_B$ to be contributed to $i_1$. Then, less current is available for $i_2$, and the voltage on resistor 24 decreases from its quiescent level. Thus, the current in pulldown transistor 7 decreases as the current in pullup transistor 2 increases. Continued increases in the current in emitter follower transistor 2 eventually result in turning off pulldown transistor 7, as indicated in segment 7C of curve 7A in FIG. 4.

However, push-pull circuit 20 does not turn off pullup transistor 2 when the output current polarity reverses. For negative values of $i_o$, the current $i_2$ is increased, and this increases the current in pulldown transistor 7. Increasing the current in transistor 7 requires a decrease in $i_1$ and a corresponding decrease in the voltage on resistor 22. Normally, this voltage decrease would decrease the current in transistor 2, but in circuit 20 the output current $i_o$ is used to produce a counteracting bias voltage increase. This occurs because the collector of pulldown transistor 7 is connected to the emitter of pullup transistor 2 instead of to output terminal 5, as in prior art circuits. Current from pulldown transistor 7 then flows through the emitter resistor 4A of emitter follower transistor 2. The resulting voltage on resistor 4A reduces the voltage at the emitter of pullup transistor 2 and therefore further forward biases pullup transistor 2 to counteract the decrease in bias caused by the above decrease in $i_2$.

Quantitative examination of the latter operation centers on the emitter-base voltage of pullup transistor 2:

$$V_{BE2} = i_1 R_3 - (i_o - i_1) R_1 \qquad (1)$$

$$V_{BE2} = i_1 (R_3 + R_1) - i_o R_1 \qquad (2)$$

In practice, $R_3 >> R_1$, and equation (2) simplifies to $$V_{BE2} = i_1 R_3 - i_o R_1 \qquad (3)$$

Thus, negative output current increases $V_{BE2}$ at the same time that decreasing $i_1$ reduces this voltage. Making the two effects cancel holds $V_{BE2}$ constant as $i_o$ swings negative and the current in pullup transistor 2 is similarly constant. To develop a negative output current, the collector current in pulldown transistor 7 is increased by an amount equal to $-i_o$. This increases the voltage on $R_2$ by $-i_o R_2$ requiring the same increase in voltage on $R_4$. The latter increase requires that $i_2$ increase by an amount $$i_2 = -i_o R_2 / R_4 \qquad (4)$$

The increase in $i_2$ results in a matching decrease in $i_1$ but $i_o$ restores the pullup transistor 2 bias. Due to the decreased $i_1$, the bias voltage on $R_3$ drops by $$i_1 R_3 = i_o R_2 R_3 / R_4 \qquad (5)$$

Simultaneously, the presence of $i_o$ increases the voltage on $R_1$ by an amount $i_o R_1$ and $$V_{BE2} = i_1 R_3 - i_o R_1 \qquad (6)$$

$$V_{BE2} = i_o R_2 R_3 / R_4 - i_o R_1 \qquad (7)$$

If these two voltage changes are of equal magnitude, the emitter-base voltage of pullup transistor 2 is unchanged. For $V_{BE2} = 0$ the circuit resistors are ratioed as $$R_1 / R_3 = R_2 / R_4$$

In other words, making the ratios of emitter and bias resistors equal for the two transistors 2 and 7 assures constant current in pullup transistor 2 for all negative levels of $i_o$. This condition is easily established because symmetrical design makes $R_1 = R_2$ and $R_3 = R_4$.

In output stage 20, the signal at the emitter of phase splitter transistor 21 is in phase with $e_i$, and the signal on conductor 23 at the collector of phase splitter transistor 21 is out of phase with $e_i$. This is important because pullup transistor 2 produces no phase inversion with respect to the output signal $e_o$, and the collector of pulldown transistor 7 does produce a phase inversion with respect to the output signal $e_o$.

Therefore, phase splitter transistor 21 effectuates current steering between the output transistors 2 and 7, and the fixed bias current $I_B$ available to set up a bias voltage on either resistor 22 or resistor 24 is accordingly steered and split between them. Stated differently, phase splitter transistor 21 steers $I_B$ between resistor 22 and 24 in order to increase conduction of current in either pullup transistor 2 or pulldown transistor 7.

Miller feedback in the collector of transistor 7 and gain associated with transistor 7 acts to greatly limit the bandwidth of the circuit path including pulldown transistor 7 compared to the circuit path including pullup transistor 2, by a factor of approximately three.

Figure 3A:
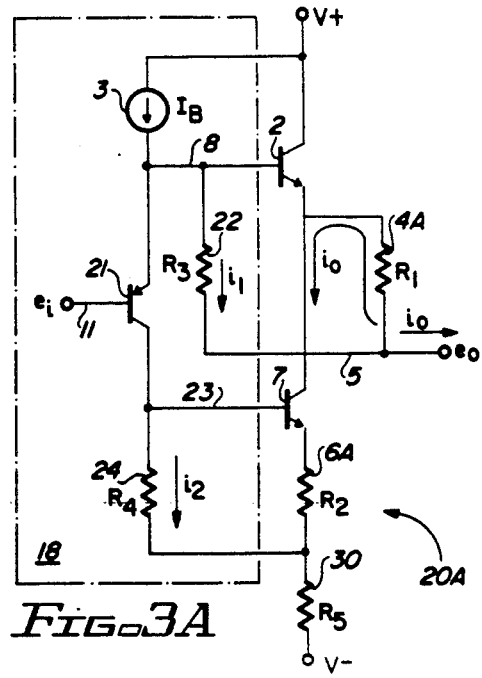
FIG. 3A is a schematic diagram of an alternate embodiment of the circuit shown in FIG. 2.

The push-pull amplifier circuit 20A of FIG. 3A includes two variations on circuit 20 of FIG. 3.

The circuit of FIG. 3 does not provide any feedback to constant bias current source 3 and does not alter the current supplied thereby. In the circuit of FIG. 3, output current $i_o$ causes adjustment of the bias of the emitter follower output device 2 by allowing the output current $i_o$ to flow through emitter follower resistor 4A, causing transistor 2 to stay in conduction. For example, if $i_o$ is positive and increasing, pullup transistor 2 supplies the current increase, in which case more of $I_B$ must be directed to flow through resistor 22. Under such conditions, less current $i_2$ will be supplied to resistor 24, and pulldown transistor 7 turns off, as indicated by segment 7C of pulldown transistor collector current curve 7A in FIG. 4. But this does not affect either bandwidth or output impedance of circuit 20, which is controlled by continuously on pullup transistor 2.

For increasingly negative values of $i_o$, it is necessary to increase the current conduction in pulldown transistor 7. In prior push-pull circuits, the collector of a pulldown transistor such as 7 would be connected directly to conductor 5, and the output current would have no affect on the bias current in a pullup transistor such as 2. However, in circuit 20 of the present invention, output current $i_o$ is conducted through resistor 4A to pullup transistor 2 and thereby restores the net emitter-base bias on transistor 2.

For increasingly negative output current $i_o$, current $i_2$ is increased in order to support the needed voltage on resistor 6A, which is $R_2$ times $i_o$. Therefore, the voltage across resistor 24 is increased. There is a corresponding net increase in $i_2$. To provide the corresponding increase in $i_2$, there must be a similar decrease in $i_1$ because the sum of $i_1$ and $i_2$ is the constant value $I_B$. Since $i_1$ has decreased, the voltage across resistor 22 decreases in a direction to reduce the emitter-base bias voltage of transistor 2. Simultaneously, the output current $i_o$ conducted through resistor 4A occurs in a direction to increase the emitter-base bias of transistor 2.

By appropriate ratioing of resistors $R_1$, $R_2$, $R_3$, and $R_4$, the output-current-related voltage drop on resistor 4A properly counteracts the bias current reduction and bias voltage reduction voltage created across resistor 22 by $i_1$. Consider the typical case where $R_3 = R_4$. Negative output current produces a voltage drop on resistor 6A that is supported by an increase in voltage on resistor 24. To produce this increase, current is diverted from resistor 22 to resistor 24. When these two resistors are equal, the voltage increase on resistor 24 results in an equal decrease in voltage on resistor 22. Thus, the voltage change that started on resistor 6A is reflected to resistor 22 but with opposite polarity. To compensate for this decrease, an equal voltage increase is developed on resistor 4A by the same output current that initiated all of the voltage changes above. The equal, compensating voltage increase on resistor 4A results when $R_1 = R_2$ in this case wherein $R_3 = R_4$.

Other circuit requirements may require that resistor 4A and resistor 6A have different resistance values. For example, these resistors typically are used for current sensing to permit output current limiting. Different current limit means for positive and negative output currents may require different resistances for these two resistors. In that case, resistors 22 and 24 are ratioed in the same manner as resistors 4A and 6A. If resistor 4A is made larger than resistor 6A by a certain percentage, then resistor 22 is made larger than resistor 24 by the same percentage. Then, when output current produces a voltage drop on resistor 6A, this voltage drop is reflected to resistor 22 with the voltage magnitude multiplied by a factor of $R_3/R_4$. The corresponding compensation voltage developed on resistor 4A is increased by the same factor if $R_1/R_2 = R_3/R_4$.

Referring to FIG. 3A, the conductivity of phase splitter transistor has been changed from PNP to NPN, as indicated by transistor 21A. Resistor 30 has been connected between V— and the lower terminals of resistors 24 and 6A for the purpose of compensating a non-ideal transistor characteristic. Changing the conductivity type of the phase splitter transistor 21A allows the base of pulldown transistor 7, rather than pullup transistor 2, to be driven by an emitter follower. Resistor 30, which has a resistance $R_5$ compensates for non-ideal characteristics of transistor 7. When negative output current is drawn through resistor 6A, there is an increase in voltage across resistor 6A. Along with that, there is an increase in the voltage on the emitter-base junction of pulldown transistor 7, which has a dynamic emitter resistance in series with resistor 6A, adding to the effective emitter resistance. For that reason, the voltage increase required across resistor 24 to support this increased emitter resistance drop is greater than explained above for the circuit of FIG. 3. $i_2$ must be increased more than discussed with reference to the circuit of FIG. 3 and $i_1$ must be decreased more than indicated above. More correction is needed for the current flowing through resistor $R_1$. The value of resistor 6A must be modified to compensate for the presence of the dynamic emitter resistance in the emitter of transistor 7.

In decreasing the resistance of resistor 6A, certain symmetry of the circuit is lost. Normally, one would like to have similar voltage drops in the emitter circuits of both transistor 2 and transistor 7 because these resistors are also used for current sensing in the current limiting function. Similar current limit circuits are generally used for the two output transistors and equal valued resistors then produce limits of equal magnitude for the positive and negative output currents. Adding resistor 30 as shown permits the resistance of resistor 6A plus the resistance of resistor 30 to be at the same value as the resistance of resistor 4A, thereby maintaining the desired symmetry.

Table 1 below shows exemplary values of the resistors in FIG. 3A.

TABLE 1

| RESISTOR | RESISTANCE |
|---|---|
| R1 | 30 ohms |
| R2 | 25 ohms |
| R3 | 3 kilohms |
| R4 | 3 kilohms |
| R5 | 5 ohms |

Push-pull output circuit stages include a unitary bias circuit that is shared between two output transistors. The amount of sharing of the bias source with the two output transistors is controlled by the input signal $e_i$ which drives the output stage. There are undoubtedly many different circuits that could be used to drive a noncomplementary push-pull amplifier output stage. A main distinction of the present invention over the prior art is that the present circuit does not alter the constant bias voltage or bias current, but nevertheless compensates for the change in the emitter-base bias applied to transistor 2 using the output current itself to flow through the emitter circuit of transistor 2.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. It should be noted that the various transistors can be field effect transistors rather than bipolar transistors.

What is claimed is:

1. A push-pull output circuit comprising in combination:

(a) a pullup transistor and a pulldown transistor of a first conductivity type, an emitter of the pullup transistor being coupled to a collector of the pulldown transistor;

(b) a first resistor coupled between an output conductor and the emitter of the pullup transistor, and a second resistor coupled between an emitter of the pulldown transistor and a first supply voltage conductor, a collector of the pullup transistor being coupled to a second supply voltage conductor; (c) a bias circuit including i. a phase splitting transistor having a first current carrying electrode coupled to a constant bias current source and a base of the pullup transistor, a second current carrying electrode coupled to a base of the pulldown transistor, and a control electrode coupled to receive an input signal, ii. a third resistor coupled between the base of the pullup transistor and the output conductor;

iii. a fourth resistor coupled between the base of the pulldown transistor and a terminal of the second resistor that is coupled to the first supply voltage conductor.

2. The push-pull output circuit of claim 1 wherein the phase splitting transistor is a PNP transistor.

3. The push-pull output circuit of claim 1 wherein the phase splitting transistor is an NPN transistor.

4. The push-pull output circuit of claim 1 wherein the phase splitting transistor is a field effect transistor.

5. The push-pull output circuit of claim 1 wherein the phase splitting transistor steers a first portion of the constant bias current into a first conductor connected to the base of the pullup transistor and the third resistor and a remaining second portion of the constant bias current into a second conductor connected to the base of the pulldown transistor and the fourth resistor in response to an input signal applied to the control electrode of the phase splitting transistor.

6. The push-pull output circuit of claim 5 wherein the resistance ratio of the first resistor to the third resistor equals the resistance ratio of the second resistor to the fourth resistor.

7. The push-pull circuit of claim 1 wherein a change in an output current flowing through the output conductor changes a base-emitter voltage of the pullup transistor by flowing through the first resistor and changing the voltage across the first resistor so as to compensate for steering of some of the current from the constant bias current source out of the first conductor so as to maintain a minimum amount of bias current flowing in the pullup transistor even when the pulldown transistor is turned on hard, thereby reducing crossover distortion, maintaining output impedance low, and increasing bandwidth of the push-pull output circuit.

8. A push-pull output circuit comprising in combination:

(a) a pullup transistor and a pulldown transistor, an emitter of the pullup transistor being coupled to a collector of the pulldown transistor;

(b) a first resistor coupled between an output conductor and the emitter of the pullup transistor, and a second resistor coupled between an emitter of the pulldown transistor and a first supply voltage conductor, a collector of the pullup transistor being coupled to a second supply voltage conductor;

(c) a unitary bias circuit including a first bias circuit coupled between the base and emitter of the pullup transistor to apply a first emitter-base voltage therebetween and a second circuit coupled between the base and emitter of the pulldown transistor to apply a second emitter-base voltage therebetween, and means coupled to a constant bias current source for steering first and second portions of a constant bias current supplied thereby into the first circuit and the second circuit, respectively, in response to an input signal and substantially independently of an output signal produced by the push-pull output circuit, to ensure that at least a minimum current in the pullup transistor is always maintained, thereby reducing crossover distortion, maintaining output impedance low, and increasing bandwidth of the push-pull output circuit.

9. A method of operating a push-pull amplifier circuit to improve cross-over distortion, output impedance, and bandwidth comprising the steps of:

(a) causing a collector current of a first output transistor to flow in an emitter of a second output transistor;

(b) causing a first portion of an output current of the push-pull amplifier circuit to flow through a first resistor connected to the emitter of the first output transistor and a second portion of the output current to flow through a second resistor connected to the base of the first output transistor;

(c) steering first and second portions of a bias current into first and second conductors, respectively, the first and second conductors being connected to the bases of the first output transistor and the second output transistor, respectively, whereby the bias portion applied to either transistor may be increased in response to a control signal applied to the steering means.

10. A push-pull output circuit comprising in combination:

(a) a first output transistor and a second output transistor of a first conductivity type, each having a control electrode, a first current-carrying electrode, and a second current-carrying electrode, the first current-carrying electrode of the first output transistor being coupled to the second current-carrying electrode of the second output transistor;

(b) a first resistor coupled between an output conductor and the first current-carrying electrode of the first output transistor, and a second resistor coupled between the first current-carrying electrode of the second output transistor and a first supply voltage conductor, the second current-carrying electrode of the first output transistor being coupled to a second supply voltage conductor (c) a bias circuit including i. a phase splitting transistor having a first current carrying electrode coupled to a constant bias current source and the control electrode of the first output transistor, a second current carrying electrode coupled to the control electrode of the second output transistor, and a control electrode coupled to receive an input signal, ii. a third resistor coupled between the control electrode of the first output transistor and the output conductor;

iii. a fourth resistor coupled between the control electrode of the second output transistor and a terminal of the second resistor that is coupled to the first supply voltage conductor.

11. A push-pull amplifier circuit with low distortion, low output impedance, and high bandwidth, comprising in combination:
 (a) a first output transistor and a second output transistor;
 (b) means for causing a collector current of the first output transistor to flow in an emitter of the second output transistor;
 (c) means for causing a first portion of an output current of the push-pull amplifier circuit to flow through a first resistor connected to the emitter of the first output transistor and a second portion of the output current to flow through a second resistor connected to the base of the first output transistor;
 (d) means for steering first and second portions of a bias current into first and second conductors, respectively, the first and second conductors being connected to the bases of the first output transistor and the second output transistor, respectively, whereby the bias portion applied to either transistor may be increased in response to a control signal applied to the steering means.

* * * * *